(12) United States Patent
Patzold

(10) Patent No.: US 11,072,040 B2
(45) Date of Patent: Jul. 27, 2021

(54) METHOD FOR PRODUCING A SLIDING SURFACE ON A MACHINE ELEMENT

(71) Applicant: Schaeffler Technologies AG & Co. KG, Herzogenaurach (DE)

(72) Inventor: Holger Patzold, Burgebrach (DE)

(73) Assignee: SCHAEFFLER TECHNOLOGIES AG & CO. KG, Herzogenaurach (DE)

(*) Notice: Subject to any disclaimer, the term of this patent is extended or adjusted under 35 U.S.C. 154(b) by 716 days.

(21) Appl. No.: 15/538,091

(22) PCT Filed: Jan. 11, 2016

(86) PCT No.: PCT/DE2016/200006
§ 371 (c)(1),
(2) Date: Jun. 20, 2017

(87) PCT Pub. No.: WO2016/112904
PCT Pub. Date: Jul. 21, 2016

(65) Prior Publication Data
US 2017/0348797 A1 Dec. 7, 2017

(30) Foreign Application Priority Data

Jan. 14, 2015 (DE) .......................... 102015200476.7
Oct. 28, 2015 (DE) .......................... 102015221041.3

(51) Int. Cl.
*F01L 1/18* (2006.01)
*B23K 26/352* (2014.01)
(Continued)

(52) U.S. Cl.
CPC .......... *B23K 26/355* (2018.08); *B23K 26/359* (2015.10); *C23C 14/5813* (2013.01);
(Continued)

(58) Field of Classification Search
CPC .............. B23K 26/355; B23K 26/359; B23K 2101/001; B23K 2103/26; B23K 9/044;
(Continued)

(56) References Cited

U.S. PATENT DOCUMENTS

| 2002/0090155 A1* | 7/2002 | Ushijima | .................. F02F 1/20 384/293 |
| 2004/0145260 A1* | 7/2004 | Tamaoka | .............. F16C 17/107 310/90 |
| 2005/0175837 A1* | 8/2005 | Massler | ................ F16C 33/043 428/408 |

(Continued)

FOREIGN PATENT DOCUMENTS

| CN | 1580347 | 2/2005 |
| DE | 102009060924 | 6/2011 |

(Continued)

OTHER PUBLICATIONS

English Translation of DE02009060924 A1 (Year: 2010).*
(Continued)

*Primary Examiner* — Tu B Hoang
*Assistant Examiner* — Tiffany T Tran
(74) *Attorney, Agent, or Firm* — Volpe Koenig

(57) ABSTRACT

The invention relates to a method for producing a sliding surface on a machine element, in particular a cam follower, wherein the machine element is first provided with a coating on at least part of the surface of the machine element, into which coating a surface structure is then introduced by laser structuring. In order to be able to introduce a surface structure that does not penetrate the coating even in the case of low layer thicknesses (s1) of the coating, the introduction of the surface structure is performed by laser interference structuring.

8 Claims, 2 Drawing Sheets

(51) Int. Cl.
  *C23C 14/58* (2006.01)
  *F01L 1/16* (2006.01)
  *B23K 26/359* (2014.01)
  *F01L 1/12* (2006.01)

(52) U.S. Cl.
  CPC ............ *C23C 14/5873* (2013.01); *F01L 1/12* (2013.01); *F01L 1/16* (2013.01); *F01L 1/18* (2013.01); *F01L 2303/00* (2020.05); *F01L 2810/02* (2013.01)

(58) Field of Classification Search
  CPC ... B23K 9/23; C23C 14/5813; C23C 14/5873; C23C 26/00; F01L 1/12; F01L 1/16; F01L 1/18; F01L 2103/00; F01L 2810/02; F01L 2303/00; F01D 5/288; F04D 29/023; F04D 29/324; F04D 29/526; F05D 2230/30; F05D 2230/90; F05D 2300/226
  USPC .......... 427/249.7, 249.1, 249.15, 249.9, 331, 427/419.1, 419.7; 384/125, 907
  See application file for complete search history.

(56) References Cited

U.S. PATENT DOCUMENTS

2005/0284434 A1   12/2005   Tsuruta et al.
2013/0316188 A1*  11/2013   Mori ........................ C22F 1/00
                                                        428/610

FOREIGN PATENT DOCUMENTS

| EP | 2682230 | 1/2014 |
| JP | H0378507 A | 4/1991 |
| JP | 2006-9080 A | 1/2006 |
| JP | 2011256717 | 12/2011 |
| JP | 2012241774 | 12/2012 |
| JP | 2014-114913 A | 6/2014 |
| WO | 2013182539 | 12/2013 |

OTHER PUBLICATIONS

English Translation of EP2686230 (Year: 2012).*
English Translation DE102009060924 (Year: 2009).*
English Translation JP2012241774 (Year: 2012).*
English Translation JP2014114913 (Year: 2014).*

* cited by examiner

METHOD FOR PRODUCING A SLIDING SURFACE ON A MACHINE ELEMENT

BACKGROUND

The invention relates to a method for producing a sliding surface on a machine element, especially a cam follower, wherein the sliding surface of the machine element is provided for sliding use in contact with at least one additional machine element, wherein the at least one additional machine element slides over the sliding surface in a sliding direction, wherein the machine element is provided on at least one part of its surface initially with a coating in which a surface structure is then formed by laser interference structuring. In addition, the invention relates to a machine element with at least one sliding surface produced according to the invention and a sliding contact with such a machine element.

From US 2005/0175837 A1, a method for producing a sliding surface on a machine element is disclosed, wherein the machine element is provided here on at least one part of its surface initially with a coating. A surface structure is then formed into the coating by laser structuring.

DE 10 2009 060 924 A1 describes a structure containing a solid lubricant for a vacuum tribological use. Here, a layer system comprising one layer made from diamond-like carbon (DLC) is formed on a substrate base and a recess structure is formed in the layer system or in the substrate base and in the layer system by means of a laser interference method, wherein this recess structure is filled with a solid lubricant.

SUMMARY

Starting from the previously described prior art, the objective of the present invention is now to create a method for producing an improved sliding surface, wherein, in the scope of this method, also for small layer thicknesses of a coating, a structure can be formed that does not penetrate through the coating.

This objective is achieved using one or more features of the invention.

According to the invention, a method for producing a sliding surface on a machine element, especially a cam follower, is provided, wherein the sliding surface of the machine element is provided for sliding use in contact with at least one additional machine element, wherein the at least one additional machine element slides over the sliding surface in a sliding direction. The machine element is provided on at least one part of its surface initially with a coating in which a surface structure is then formed by laser interference structuring. Viewed perpendicular to a coating surface of the coating, the surface structure is formed from a number of closed structural elements.

It has been shown, namely, that sliding surfaces can be achieved with especially good sliding properties if a liquid lubricant used in connection with these surfaces remains adhered to the toothed surface structure as long as possible. Accordingly, the surface structure must provide a volume filled with the liquid lubricant and must provide or discharge the lubricant as a function of the load and the speed of the additional machine element sliding over in the sliding direction.

It was recognized that here it is of special significance in what direction the sliding load is applied to the sliding surface. Therefore, structure elements are formed that, when an additional machine element slides over top, increase a pressure of the lubricant in the volume of the structure element and—viewed in the sliding direction—increase the hydrostatic pressure at the end of the structure element and enable the establishment of a hydrodynamic lubricant cushion.

A structure element is to be considered "closed" according to the invention if, viewed perpendicular to the coating surface, it is surrounded on its periphery by the coating, i.e., not in contact with the periphery of the coating. Such a construction of the structure elements provides bounded, trough-shaped relationships for holding the lubricant, so that the lubricant cannot escape without additional measures.

In particular, a closed structure element, viewed perpendicular to the coating surface, has a surface extent of maximum 10% of the sliding surface. This guarantees that, when an additional machine element slides over the sliding surface, hydrodynamic lubricant cushions are formed at sufficient locations of the sliding surface and a kind of "aquaplaning" effect between the sliding partners is generated.

In particular, the closed structure elements are formed with a linear construction as linear sections or point-shaped as cavities. A length of the closed, linear structure elements is selected preferably in the range from approximately 20 µm to 10 mm, in particular, in the range from 20 µm to 5 mm. Point-shaped structure elements are provided, in particular, if the sliding surface is exposed not only to dynamic loads, but also to static loads or if the sliding speed can be very small or even zero.

Preferably, the coating surface is divided into two halves parallel to the sliding direction by a virtual center line and structure elements in the form of linear sections are aligned at an angle Y≠0 relative to the virtual center line. In particular, the linear structure elements, viewed in the sliding direction, are oriented pointing at the angle Y≠0 relative to the virtual center line. These measures further promote the formation of the hydrodynamic lubricant cushions.

In particular, every two of the linear structure elements form a V-shaped structure, wherein a peak of this V-shaped structure is arranged pointing in the sliding direction. Therefore, the hydrodynamic pressure is especially increased, because the lubricant is pressed out from the two linear structure elements by a machine element sliding over top into the area of the tip of the V and generates there, in an especially effective way, the hydrodynamic lubricant cushion.

Preferably, the coating and also the structuring of the machine element are provided only in areas of the coating surface on which the machine element forms a sliding contact with other/additional machine elements in later use. This part or these parts of the coating surface or optionally also the entire coating surface represents one or more corresponding sliding surfaces.

In general, with the help of a coating of the surface of the machine element with a suitable material, the sliding property is improved, while with the help of the structuring, selected reservoirs can be created for the lubricant, by which the presence of a sufficient quantity of lubricant between the rubbing partners can always be guaranteed. Through corresponding shaping of this structure, an effect similar to the aquaplaning effect can be generated, so that one friction partner virtually floats on the other friction partner due to the existing quantity of lubricant.

The surface structure is formed by laser interference structuring. In other words, the laser structuring is actually implemented in the form of laser interference structuring.

Such a method has the advantage that with the help of the laser interference structuring, microstructures can be constructed with small depth, wherein these structures can be defined exactly and produced periodically one after the other for simultaneously low production times. Therefore, because very small structure depths can be realized by surface structure even for a small layer thickness. In the laser interference structuring, in a way known to someone skilled in the art, multiple laser beams are used for the joint construction of the respective structuring.

If a classic laser structuring method is used, very small structure depths cannot be produced, which leads to a penetration of the coating if the coating has small layer thicknesses. In general, the degrees of freedom with regard to the matching of the coating and the structuring to each other are limited.

According to one embodiment of the invention, a depth of a formed surface structure equals, in ratio to a layer thickness of the coating, 0.5. Here, a suitable interaction of the coating with the surface structure can be implemented.

In refinement of the invention, a chrome-nickel layer (CrNi layer) or a layer made from amorphous carbon is deposited as the coating, so that suitable sliding properties of the machine element can be implemented in the corresponding area of its surface. In principle, however, other types of coatings can also be provided on the surface of the machine element.

Here, in addition to an amorphous carbon layer (DLC), multiple amorphous carbon layers (DLC) can also be deposited. Furthermore, one or more hard coatings made from nitrides, carbides, oxides, also mixed shapes and/or multilayers, can also be deposited. The deposition of one coating in the form of one or more hard chrome layers, manganese and/or zinc phosphate layers, metal sulfide layers, graphite layers, PTFE layers, and also a browning coating, have proven effective.

Another possible construction of the invention is that the sliding surface of a cam follower, in particular, a bucket tappet, a rocker arm, a pump tapper, or the like, is produced. Thus, the cam follower can be a bucket tappet or also a lever-shaped cam follower for a valve train system of an internal combustion engine or else also a component of a pump. In addition, the method according to the invention could also be used for producing a sliding surface on a chain pin.

According to another advantageous embodiment of the invention, the surface structure has a non-uniform construction. This non-uniformity can be implemented by the provision of different structure depths and/or the provision of different structure geometries and/or a different density of structures, so that on the surface of the machine element, it is possible to adjust the sliding surface to different sliding speeds occurring during operation. Thus, in one area of the surface, a larger number of structure elements can be provided, where high sliding speeds occur and therefore more lubricant is to be provided. The surface structure, however, can also have a uniform construction on the machine element. In an especially preferred way, the structure depth of the surface structure has a different construction in the area of a closed structure element, in order to still support the pressure build-up for forming the lubricant cushion within the structure element.

Another possible construction of the invention is that the coating has a layer thickness of 0.05 to 6 μm in which the surface structure is formed with a depth of 0.01 μm to 0.4 μm. In principle, however, a deeper structuring up to 30 μm or even deeper is also possible if this is technically useful in the individual case. In general, the provision of a smaller structure depth in comparison to the layer thickness implements a holding of the lubricant on the coating surface.

A sliding contact that is formed from a machine element according to the invention and at least one additional machine element has proven effective, wherein the sliding surface of the machine element is provided for sliding use in contact with the at least one additional machine element, wherein the at least one additional machine element is provided for sliding over the sliding surface in a sliding direction, and wherein the sliding surface is provided with an overall liquid lubricant.

Here, in particular, a liquid lubricant is used in the form of oil, in particular, SAE code 0W-x, or a diesel fuel. The smaller the value for the letter x in the SAE code 0W-x, the lower the viscosity of the lubricant.

BRIEF DESCRIPTION OF THE DRAWINGS

The invention is not limited to the specified combination of features of the main claim or the claims dependent on this main claim. It is also possible to combine individual features, also those that emerge from the claims, the following description of a preferred embodiment of the invention, or directly from the drawing. The references in the claims to the drawing through the use of reference symbols should not limit the scope of protection of the claims. Shown are:

DETAILED DESCRIPTION OF THE PREFERRED EMBODIMENTS

Figure 1:
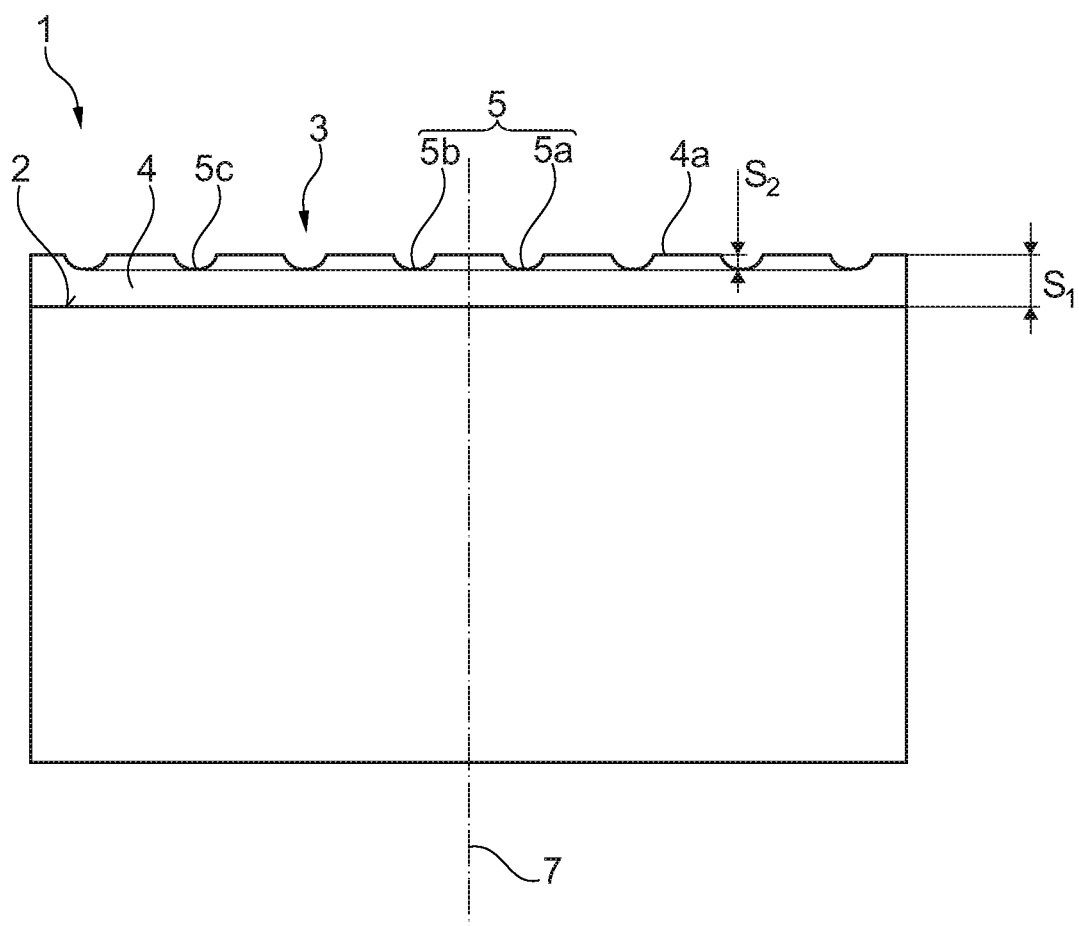
FIG. 1 a machine element in a section diagram.

FIG. 1 shows a part of a machine element 1 in a section diagram, wherein this machine element 1 is a cam follower, for example, a bucket tappet, a rocker arm, or the like. On its surface 2, the machine element 1 is equipped with a sliding surface 3 for contact with an additional machine element not shown here, wherein for forming the sliding surface 3, initially a coating 4 was deposited on the surface 2.

In the present case, the coating 4 that can be a chrome-nickel layer or also a layer made from amorphous carbon has a coating surface 4a and a layer thickness s1 that is in the range from 0.05 to 1.2 μm. Next to the coating 4, a surface structure 5 is then formed into the coating surface 4a, wherein this structuring was produced by laser interference structuring. Here, closed structure elements 5a, 5b, 5c are formed by the interaction of multiple laser beams, wherein a structure depth s2 of the surface structure 5 is in the range of 0.15 to 0.4 μm. In this respect, the coating 4 is not penetrated by the surface structure 5. With the help of the laser interference structuring, this can also be implemented for smaller layer thicknesses s1. The reference symbol 7 designates a virtual center line 7 of the sliding surface 3.

By a method according to the invention for producing a sliding surface, surface structures can thus be constructed on a coating of a machine element without the coating being penetrated.

Figure 2:
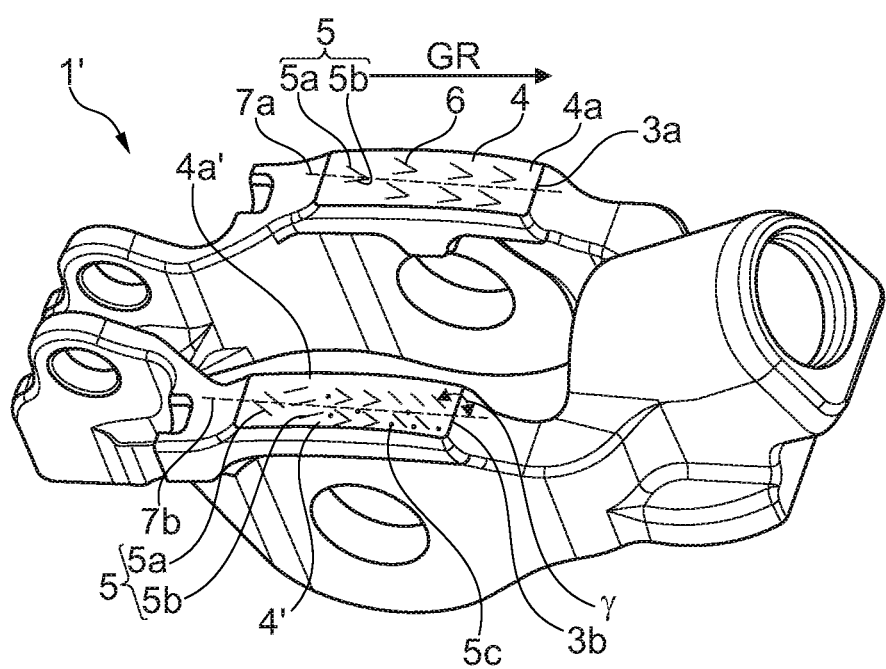
FIG. 2 a three-dimensional view of a machine element in the form of a rocker arm.

FIG. 2 shows a three-dimensional view of a machine element 1' in the form of a rocker arm with two sliding surfaces 3a, 3b. The sliding surfaces 3a, 3b of the machine element 1' are provided for the sliding use in contact with at least one additional machine element not shown here, wherein the at least one additional machine element slides over the sliding surfaces 3a, 3b in a sliding direction GR.

The machine element 1' is provided in each of two areas of its surface 2 (compare FIG. 1) with a coating 4, 4' in which a surface structure 5 is then formed by means of laser interference structuring comprising linear structure elements 5a, 5b and point-shaped structure elements 5c.

Here, viewed perpendicular to a coating surface 4a, 4a' of the coating 4, 4', the respective coating surface 4a, 4a' is divided into two halves parallel to the sliding direction GR by a virtual center line 7a, 7b. The surface structure 5 is formed comprising a number of linear structure elements 5a, 5b that are oriented at an angle $Y \neq 0$ relative to the virtual center line 7a, 7b. Here, several of the linear structure elements 5a, 5b form, in paired arrangement, a V-shaped structure 6, wherein a tip of this V-shaped structure 6 is arranged pointing in the sliding direction GR.

Therefore, the hydrodynamic pressure of an overall liquid lubricant that is deposited on the sliding surfaces 3a, 3b, is, in particular, increased, because the lubricant is pressed out from the two linear structure elements 5a, 5b by a machine element sliding over top in the area of the tip of the V and there generates, in an especially effective way, the hydrodynamic lubricant cushion.

LIST OF REFERENCE NUMBERS

1, 1' Machine element
2 Surface
3, 3a, 3b Sliding surface
4, 4' Coating
4a, 4a' Coating surface
5 Surface structure
5a, 5b, 5c Structure element
5 Structure
7, 7a, 7b Virtual center line
$s_1$ Layer thickness
$s_2$ Structure depth

The invention claimed is:

1. A method for producing a sliding surface on a machine element, wherein the sliding surface of the machine element is configured for sliding contact and is configured to slide in a sliding direction, the method comprising:

providing the machine element on at least one part of a surface thereof initially with a coating, forming a surface structure thereon by laser interference structuring, such that the formed surface structure when viewed perpendicular to a coating surface of the coating, comprises a number of closed structure elements, forming the number of closed structure elements in a linear construction as linear sections, wherein every two of said linear sections are formed as a discrete, individually formed V-shaped structure, with a tip of said V-shaped structure arranged pointing directly in the sliding direction, and a plurality of the V-shaped structures are formed in a row such that each V-shaped structure of the plurality of V-shaped structures are spaced from each other, and all areas of the coating which do not comprise the plurality of the V-shaped structures have the same depth normal to the sliding surface.

2. The method according to claim 1, wherein each of said closed structure elements, viewed perpendicular to the coating surface, is constructed in a surface extent of maximum 10% of the sliding surface.

3. The method according to claim 1, wherein the coating surface is divided into two halves that extend parallel to the sliding direction by a virtual center line and the linear sections are oriented at an angle $y \neq$ relative to the virtual center line.

4. The method according to claim 1, wherein a ratio of a structure depth (s2) of the formed surface structure to a layer thickness (s1) of the coating is 0.5.

5. The method according to claim 1, wherein a CrNi layer or a layer made from amorphous carbon is deposited as the coating.

6. The method according to claim 1, wherein the sliding surface is a surface of a cam follower.

7. The method according to claim 1, wherein the surface structure has a non-uniform construction.

8. The method according to claim 1, wherein a number of the closed structure elements of the surface structure is greater in areas of greater sliding speeds.

* * * * *